(12) United States Patent
Smith et al.

(10) Patent No.: US 7,925,486 B2
(45) Date of Patent: Apr. 12, 2011

(54) COMPUTER-IMPLEMENTED METHODS, CARRIER MEDIA, AND SYSTEMS FOR CREATING A METROLOGY TARGET STRUCTURE DESIGN FOR A RETICLE LAYOUT

(75) Inventors: Mark Smith, Austin, TX (US); Robert Hardister, Austin, TX (US); Mike Pochkowski, Round Rock, TX (US); Amir Widmann, Sunnyvale, CA (US); Elyakim Kassel, Misgav (IL); Mike Adel, Zichron Ya'akov (IL)

(73) Assignee: KLA-Tencor Technologies Corp., Milpitas, CA (US)

( * ) Notice: Subject to any disclaimer, the term of this patent is extended or adjusted under 35 U.S.C. 154(b) by 0 days.

(21) Appl. No.: 11/685,501

(22) Filed: Mar. 13, 2007

(65) Prior Publication Data
US 2007/0276634 A1    Nov. 29, 2007

Related U.S. Application Data

(60) Provisional application No. 60/782,075, filed on Mar. 14, 2006.

(51) Int. Cl.
   *G06F 17/50* (2006.01)
   *G02B 23/10* (2006.01)
(52) U.S. Cl. .......................................... 703/13; 356/252

(58) Field of Classification Search .......... 356/250–252; 359/424, 428, 505, 461; 700/121; 703/13, 703/20–22; 716/4, 19–21
See application file for complete search history.

(56) References Cited

U.S. PATENT DOCUMENTS 5,821,015 A    10/1998  Sugawara
(Continued)

FOREIGN PATENT DOCUMENTS

WO    03/043075    5/2003

OTHER PUBLICATIONS

U.S. Appl. No. 60/729,268, filed Oct. 21, 2005, Widmann et al.
(Continued)

*Primary Examiner* — Paul L Rodriguez
*Assistant Examiner* — Andre Pierre Louis
(74) *Attorney, Agent, or Firm* — Ann Marie Mewherter

(57) ABSTRACT

Computer-implemented methods, carrier media, and systems for creating a metrology target structure design for a reticle layout are provided. One computer-implemented method for creating a metrology target structure design for a reticle layout includes simulating how one or more initial metrology target structures will be formed on a wafer based on one or more fabrication processes that will be used to form a metrology target structure on the wafer and one or more initial metrology target structure designs. The method also includes creating the metrology target structure design based on results of the simulating step.

18 Claims, 1 Drawing Sheet

U.S. PATENT DOCUMENTS

| | | | |
|---|---|---|---|
| 6,130,750 | A | 10/2000 | Ausschnitt et al. |
| 6,248,602 | B1* | 6/2001 | Bode et al. ............... 438/14 |
| 6,581,193 | B1* | 6/2003 | McGhee et al. ............ 716/4 |
| 6,886,153 | B1* | 4/2005 | Bevis ........................ 716/19 |
| 7,346,878 | B1* | 3/2008 | Cohen et al. .............. 716/11 |
| 7,480,050 | B2 | 1/2009 | Den Boef et al. |
| 2004/0017575 | A1 | 1/2004 | Balasubramanian et al. |
| 2004/0181768 | A1* | 9/2004 | Krukar ....................... 716/19 |
| 2004/0216065 | A1* | 10/2004 | Cobb et al. ................. 716/8 |
| 2005/0010890 | A1* | 1/2005 | Nehmadi et al. ........... 716/19 |
| 2005/0173634 | A1* | 8/2005 | Wong et al. ................ 250/311 |
| 2006/0012763 | A1 | 1/2006 | Hinnen et al. |
| 2006/0024850 | A1 | 2/2006 | Monahan et al. |
| 2006/0062445 | A1 | 3/2006 | Verma et al. |
| 2006/0095208 | A1* | 5/2006 | Hirscher et al. ............ 702/1 |
| 2007/0050749 | A1 | 3/2007 | Ye et al. |

OTHER PUBLICATIONS

U.S. Appl. No. 10/858,836, filed Jun. 1, 2004, Cohen et al.

U.S. Appl. No. 11/154,310, filed Jun. 16, 2005, Verma et al.

Extended European Search Report for European Patent Application No. 07758540.4 mailed Feb. 25, 2010.

International Search Report & Written Opinion, PCT/US2007/063995, mailed Dec. 6, 2007.

* cited by examiner

COMPUTER-IMPLEMENTED METHODS, CARRIER MEDIA, AND SYSTEMS FOR CREATING A METROLOGY TARGET STRUCTURE DESIGN FOR A RETICLE LAYOUT

PRIORITY CLAIM

This application claims priority to U.S. Provisional Application No. 60/782,075 entitled "Computer-Implemented Methods, Simulation Engines, and Systems for Creating a Metrology Target Structure Design," filed Mar. 14, 2006, which is incorporated by reference as if fully set forth herein.

BACKGROUND OF THE INVENTION

1. Field of the Invention

This invention generally relates to computer-implemented methods, carrier media, and systems for creating a metrology target structure design for a reticle layout. Certain embodiments relate to a computer-implemented method that includes simulating how one or more initial metrology target structures will be formed on a wafer based on one or more fabrication processes and one or more initial metrology target structure designs and creating the metrology target structure design based on results of the simulating step.

2. Description of the Related Art

The following description and examples are not admitted to be prior art by virtue of their inclusion in this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

As the dimensions of advanced semiconductor devices continue to shrink, process control windows are shrinking commensurately. Accordingly, monitor and control of semiconductor processes are and will continue to be of significant importance in semiconductor development and manufacturing. Consequently, significant efforts have been and will continue to be made to improve the target structures that can be measured and used to monitor and control semiconductor fabrication processes.

Currently, metrology engineers work with graphical data stream (GDS) metrology target libraries or collaborate with layout engineers to modify generic target designs based on known rules of thumb in order to make a best effort to design metrology target structures that are compatible with lithographic design rules, process constraints, and metrology performance considerations. Another common methodology for metrology target structure optimization includes printing several different metrology target structure designs side by side on a wafer. Optimization may be performed for the device itself, and then the best target of the several that were printed may be selected for use for fabrication of the device.

There are, however, a number of disadvantages to creating the metrology target structures as described above. For instance, such creation of metrology target structures is substantially time consuming. In particular, the trial and error nature of such approaches to metrology structure design take a relatively long time. Creating the metrology structures in this manner can also sometimes take up to three mask design iterations until the design is satisfactory. In addition, such creation of metrology structures requires technical input from a number of different domain experts who may not always be available to support the metrology engineer. Furthermore, creating metrology structures in such a manner can result in target designs that are suboptimal in at least one of the three areas that include lithography compatibility, process compatibility, and metrology compatibility. Moreover, the methods described above, which involve printing several different metrology target structure designs side by side on a wafer, are cumbersome since these methods require particular optimization of the metrology targets instead of allowing optimization to be concentrated on the device printing and processing.

Accordingly, it would be advantageous to develop computer-implemented methods, carrier media, and/or systems for creating a metrology target structure design for a reticle layout that reduces the number of design cycles involved in the design process and automates the design process therefore reducing the work load and level of expertise required of the metrology engineer to perform target design and insertion into test and/or product reticles.

SUMMARY OF THE INVENTION

The following description of various embodiments of computer-implemented methods, carrier media, and systems is not to be construed in any way as limiting the subject matter of the appended claims.

One embodiment relates to a computer-implemented method for creating a metrology target structure design for a reticle layout. The method includes simulating how one or more initial metrology target structures will be formed on a wafer based on one or more fabrication processes that will be used to form a metrology target structure on the wafer and one or more initial metrology target structure designs. The method also includes creating the metrology target structure design based on results of the simulating step.

In one embodiment, all steps of the computer-implemented method are performed automatically. In another embodiment, all steps of the computer-implemented method are performed prior to fabrication of a reticle using the reticle layout.

In one embodiment, the method includes generating the one or more initial metrology target structure designs using a set of rules selected based on one or more parameters describing the one or more fabrication processes. In another embodiment, the method includes generating the one or more initial metrology target structure designs by simulating measurements of the one or more initial metrology target structures based on one or more metrology processes that will be used to measure the metrology target structure on the wafer. In an additional embodiment, the method includes generating the one or more initial metrology target structure designs using a set of rules selected based on one or more parameters describing one or more metrology processes that will be used to measure the metrology target structure on the wafer.

In one embodiment, the method includes simulating measurements of the one or more initial metrology target structures formed on the wafer based on the results of simulating how the one or more initial metrology target structures will be formed on the wafer and one or more metrology processes that will be used to measure the metrology target structure on the wafer. In one such embodiment, the creating step includes creating the metrology target structure design based on the results of simulating how the one or more initial metrology target structures will be formed on the wafer and results of simulating the measurements.

In some embodiments, the simulating step includes simulating how the one or more initial metrology target structures will be formed on the wafer at different values of one or more parameters of the one or more fabrication processes. In one such embodiment, the creating step includes determining a process window for the one or more initial metrology target structure designs based on the results of the simulating step and selecting the initial metrology target structure design having the largest process window as the created metrology target structure design. In another such embodiment, the creating step includes determining a process window for the one or more initial metrology target structure designs based on the results of the simulating step, comparing the process window for the one or more initial metrology target structure designs to a process window for device structures to be formed on the wafer using the one or more fabrication processes, and selecting the metrology target structure design based on the one or more initial metrology target structure designs that have a process window that is larger than the process window for the device structures.

In some embodiments, the creating step includes applying constraints to the results of the simulating step. The constraints represent limitations for the one or more fabrication processes and one or more metrology processes that will be used to measure the metrology target structure on the wafer. In another embodiment, the creating step includes optimizing one of the one or more initial metrology target structure designs based on the results of the simulating step. In an additional embodiment, the method includes storing a layout for the created metrology target structure design in a standard format for the reticle layout.

In one embodiment, the one or more fabrication processes include lithography. In another embodiment, the one or more fabrication processes include etch. In an additional embodiment, the one or more fabrication processes include chemical-mechanical polishing. In a further embodiment, the one or more fabrication processes include deposition.

In some embodiments, the creating step includes determining if the one or more initial metrology target structure designs are compatible with the one or more fabrication processes based on the results of the simulating step. In another embodiment, the creating step includes determining if the one or more initial metrology target structure designs are compatible with one or more metrology processes that will be used to measure the metrology target structure on the wafer.

Each of the steps of the method described above may be performed as described further herein. In addition, each of the embodiments of the method described above may include any other step(s) of any other method(s) described herein. Furthermore, each of the embodiments of the method described above may be performed by any of the systems described herein.

Another embodiment relates to a carrier medium that includes program instructions executable on a computer system for performing a computer-implemented method for creating a metrology target structure design for a reticle layout. The computer-implemented method includes simulating how one or more initial metrology target structures will be formed on a wafer based on one or more fabrication processes that will be used to form a metrology target structure on the wafer and one or more initial metrology target structure designs. The method also includes creating the metrology target structure design based on results of the simulating step.

The carrier medium described above may be further configured as described herein. The steps of the computer-implemented method may be performed as described further herein. In addition, the computer-implemented method for which the program instructions are executable may include any other step(s) of any other method(s) described herein.

An additional embodiment relates to a system configured to create a metrology target structure design for a reticle layout. The system includes a simulation engine configured to simulate how one or more initial metrology target structures will be formed on a wafer based on one or more fabrication processes that will be used to form a metrology target structure on the wafer and one or more initial metrology target structure designs. The system also includes a computer system configured to create the metrology target structure design based on output of the simulation engine. The system may be further configured as described herein.

BRIEF DESCRIPTION OF THE DRAWINGS

Other objects and advantages of the invention will become apparent upon reading the following detailed description and upon reference to the accompanying drawings in which.

Figure 1:
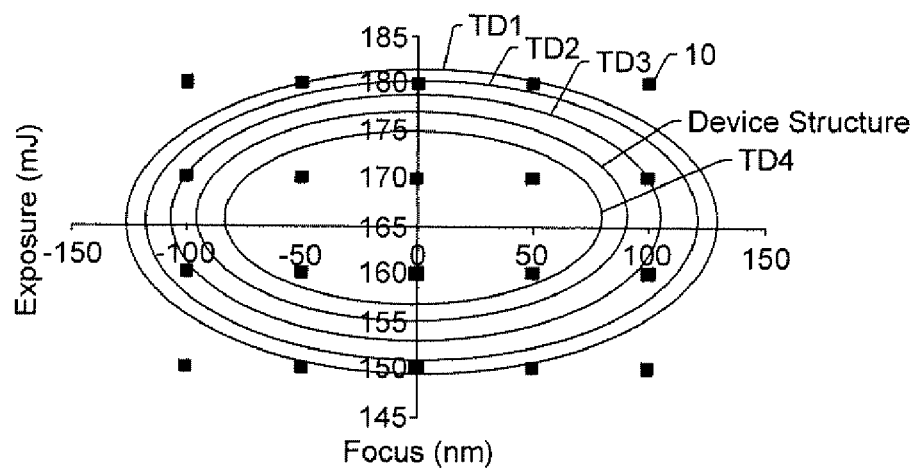
FIG. 1 is a plot illustrating one example of results of an embodiment of a computer-implemented method for creating a metrology target structure design for a reticle layout.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "reticle," "mask," and "photomask" are used interchangeably herein. A reticle generally includes a transparent substrate such as glass, borosilicate glass, and fused silica having patterned regions of opaque material formed thereon. The opaque regions may be replaced by regions etched into the transparent substrate. Many different types of reticles are known in the art, and the term reticle as used herein is intended to encompass all types of reticles.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. One or more layers may formed be upon a wafer. For example, such layers may include, but are not limited to, a resist, a to dielectric material, a conductive material, and a semiconductive material. Many different types of such layers are known in the art, and the term wafer as used herein is intended to encompass a wafer on which all types of such layers may be formed.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Although various embodiments are described herein with respect to metrology targets, it is to be understood that all of the embodiments described herein can also be used for overlay and alignment targets, as well as any other type of metrology targets. In other words, the term "metrology target structure" as used herein is generally defined as any structure that will be used to monitor and/or control one or more processes performed on the wafer. For example, a "metrology target structure" may include any structure that can be used to monitor and/or control one or more parameters of one or more processes performed on a wafer such as overlay, alignment, critical dimension, etc., or some combination thereof.

The embodiments described herein generally relate to processes for designing and inserting metrology target structures into test and product reticles. As metrology target structures migrate from the scribe line area of a design into the device area of the design, designing and inserting metrology target structures into reticles is becoming more complex and requires extensive process integration and lithography expertise. However, the embodiments described herein may advantageously be used to automate the design process. For example, in some embodiments, all of the steps of the computer-implemented method embodiments described herein are performed automatically (e.g., by program instructions executable on a computer system or by a system as described further herein). In addition, the embodiments described herein advantageously shorten the number of design cycles involved in the design process and automate the design process thereby reducing the work load and level of expertise required of the metrology engineer to perform metrology target structure design and insertion.

One embodiment relates to a computer-implemented method for creating a metrology target structure design for a reticle layout. The method may include creating a metrology target structure design for a layout for a product reticle or a test reticle. The method includes simulating how one or more initial metrology target structures will be formed on a wafer based on one or more fabrication processes that will be used to form a metrology target structure on the wafer and one or more initial metrology target structure designs.

The one or more initial metrology target structure designs may be selected and/or generated in a number of different manners. For example, a user of the embodiments described herein may accept some or all of one or more initial metrology target structure designs suggested by the computer-implemented method or select one or more initial metrology target structure designs from a set of initial metrology target structure designs (e.g., from a list). Therefore, although all steps of the computer-implemented method may be performed automatically, a user of software and/or hardware configured to perform one or more of the embodiments of the computer-implemented methods described herein may perform one or more of the following steps. In addition, the user may perform one or more of the steps with assistance from the embodiments described herein (e.g., in user-assisted steps of the computer-implemented method).

The initial metrology target structure designs may include previously used metrology target structure designs. In addition, the initial metrology target structure designs may be selected by the embodiments described herein. For example, based on some information about the reticle layout, one or more fabrication processes that will be used to form the metrology target structure on the wafer, one or more metrology processes that will be used to measure one or more characteristics of the metrology target structure formed on the wafer, or some combination thereof, the embodiments may use a set of rules to determine which previously used metrology target structure designs may be suitable for the reticle layout. In this manner, the method may use process layer guidelines to select one or more initial metrology target structure designs for use in the embodiments described herein. In one such example, if the reticle layout includes memory device structures, then the embodiments described herein may select metrology target structure designs that have been used for memory device fabrication but perhaps not metrology target structure designs that have only been used for logic device fabrication. Such selection of the one or more initial metrology target structure designs may be performed by the computer-implemented method in any suitable manner.

The method may also include generating the one or more initial metrology target structure designs. For example, in one embodiment, the method includes generating the one or more initial metrology target structure designs by simulating measurements of the one or more initial metrology target structures based on one or more metrology processes that will be used to measure the metrology target structure on the wafer. In this manner, the initial metrology target structure design(s) may be generated using results of one or more metrology simulations. Such simulations may be performed as described further herein except that to generate the one or more initial metrology target structure designs input to a model of the metrology process(es) may be, for example, desirable measurement results and the output may be one or more initial metrology target structure designs that will produce such results. The measurements that are simulated in this step may include any suitable measurements known in the art. In addition, the one or more metrology processes may include any suitable metrology process(es) known in the art.

In another embodiment, the method includes generating the one or more initial metrology target structure designs using a set of rules selected based on one or more parameters describing the one or more fabrication processes. In this manner, the method may use process layer guidelines to generate one or more initial metrology target structure designs for use in the embodiments described herein. For example, the initial metrology target structure design(s) may be generated using a set of rules that may vary depending on the parameters describing the lithography or photolithography (and possibly other fabrication) processes. In one such example, the set of rules may be defined based on parameters of the one or more fabrication processes such as the smallest critical dimension (CD) of features that can be printed by the one or more fabrication processes. In this example, the set of rules may include a rule that limits the CD of the one or more initial metrology target structure designs to CDs greater than the smallest CD that can be printed by the one or more fabrication processes. The set of rules may include other rules that vary depending on any other parameters of the one or more fabrication processes.

In an additional embodiment, the method includes generating the one or more initial metrology target structure designs using a set of rules selected based on one or more parameters describing one or more metrology processes that will be used to measure the metrology target structure on the wafer. As such, the initial metrology target structure design(s) may be generated using a set of rules that may vary depending on parameters describing the selected metrology system. For example, the set of rules may be defined based on parameters such as the smallest CD of features formed on a wafer that can be measured by the one or more metrology processes. In one such example, the set of rules may include a rule that limits the CD of the one or more initial metrology target structure designs to CDs greater than the smallest CD that can be measured by the one or more metrology processes. Furthermore, the initial metrology target structure design(s) may be generated using a set of rules that vary depending on the parameters describing the lithography or photolithography process, other fabrication processes, and the selected metrology system.

A number of steps may be performed using the one or more initial metrology target structure designs prior to performing the simulations described herein. For example, the method may include converting the one or more initial metrology target structure designs into a suitable format such as a graphical data stream (GDS) format or any suitable other format for input to the simulations described herein. In addition, the method may include running the one or more initial metrology target structure designs through a computer-aided design (CAD) tool for optical proximity correction (OPC) features to determine if the one or more initial metrology target structure designs cause violations. If the one or more initial metrology target structure designs cause any violations, the one or more initial metrology target structure designs may be altered and the above-described steps may be performed until the one or more initial metrology target structure designs cause no violations.

The one or more initial metrology target structure designs may be input to one or more process simulations. In one embodiment, the one or more fabrication processes include lithography. For example, the method may use a wafer simulation model, or "lithography process model," to predict how the one or more initial metrology target structure designs will appear when printed at the wafer level. The wafer simulation model may include parameters that account for variations in the lithography process as well as a resist and/or one or more additional layers formed on the wafer. The one or more parameters of the model may include, for example, the resist thickness, the composition of the resist, one or more characteristics (e.g., thickness and composition) of layers formed on the wafer under and/or on top of the resist, the wavelength of the exposure, the numerical aperture (NA) of the exposure tool, the coherence of the exposure tool, dose of the exposure, focus of the exposure, etc.

A user may also set up a lithography or photolithography simulator so that the simulator represents the process layer for which the metrology target structure is being designed. For example, the user may select values for one or more parameters of a model describing the lithography or photolithography process. The parameter(s) of the model may include any of the parameters described herein.

The results of the simulating step may include images illustrating how the one or more initial metrology target structures will be formed on the wafer or any other output that is indicative of how the one or more initial metrology target structures will be formed on the wafer.

The method may include determining if the one or more initial metrology target structure designs are compatible with the one or more fabrications processes based on the results of the simulating step. For example, the method may include determining the printability (e.g., lithographic printability) of the one or more initial metrology target structure designs on the wafer. For example, determining the printability of the one or more initial metrology target structure designs may include comparing simulated images to an ideal image of the printed initial metrology target structures. The ideal image(s) may be generated directly from the initial metrology target structure design(s) and may generally be representative of how the metrology engineer would like the initial metrology target structure(s) to be formed on the wafer. Alternatively, the simulated images may be compared directly to the initial designs themselves.

Comparing the simulated images to the ideal image may also or alternatively include comparing any one or more characteristics of the simulated images and the ideal image. Such characteristics may include, for example, CD, sidewall angle, profile, edge placement of individual features, any other comparable characteristic(s) of the images, or some combination thereof. Such characteristic(s) of the simulated images may be determined using one or more algorithms and/or methods (e.g., image processing algorithms commonly used in image-based metrology processes). In addition, one or more characteristics of the initial metrology target structures as will be formed on the wafer may be determined from the simulation results and compared to one or more characteristics of the one or more initial metrology target structure designs. Such a comparison may include comparing any of the characteristics described herein.

Differences identified by any of the comparing steps described above may be used to determine if the one or more initial metrology target structure designs are printable on the wafer and how well the initial metrology target structure designs print on the wafer. For example, simulation results for initial metrology target structure designs that do not differ significantly from the designs themselves may be determined to be more printable than initial metrology target structure designs whose simulation results exhibited larger differences from their respective designs. Initial metrology target structures that are more printable will be more compatible with the lithography process. In a similar manner, the compatibility of the initial metrology target structure designs with the lithography process may be determined based on how well the simulation results for each of the initial metrology target structure designs match its corresponding design.

In one embodiment, the simulating step includes simulating how the one or more initial metrology target structures will be formed on the wafer at different values of one or more parameters of the one or more fabrication processes. For example, the simulations described above may be performed at the best focus and exposure conditions for the lithography process and/or across some range of values for the focus and exposure conditions such as the full range of expected dose/focus conditions commonly referred to as the "process window." In this manner, in one embodiment, simulating how the one or more initial metrology target structures will be formed on the wafer includes generating simulated images that illustrate how the one or more initial metrology target structures will be printed on a wafer by a lithography process at different process parameters. The different process parameters may include different types of lithography exposure tools and/or any one or more other parameters described herein.

Multiple wafer simulation models may be used to perform the simulations described above at different values of the process parameters. For example, one of the wafer simulation models may include best known focus and exposure conditions. Other wafer simulation models may include other dose/focus conditions that are expected to be within the process window for device structures to be formed on the wafer using the one or more fabrication processes. The printability of the one or more initial metrology target structure designs may be determined for each simulation that is performed, and the results may be used to determine an approximate process window for the one or more initial metrology target structure designs.

In some embodiments, simulating how the one or more initial metrology target structures will be formed on a wafer includes simulating how the one or more initial metrology target structures will be formed on a reticle and using results of simulating how the one or more initial metrology target structures will be formed on the reticle to simulate how the one or more initial metrology target structures will be formed on the wafer. In this manner, the one or more fabrication processes may include reticle manufacturing and lithography (wafer lithography). Simulating how one or more initial metrology target structures will be printed on the reticle may be performed using the one or more initial metrology target structure designs as input to a model of a reticle manufacturing process.

In such embodiments, the one or more initial metrology target structure designs may be in the form of a MEBES jobdeck, a GDSII file, OASIS data, or any other standard file types. The method may include altering the initial metrology target structure designs by applying any mask processing biases to the designs before the simulations are performed. Mask processing biases are changes to the design that are usually performed by mask manufacturers to account for known effects of the reticle manufacturing processes on characteristics of the reticle features. For example, often a mask manufacturer will increase the size of features in the design prior to manufacturing to account for reductions in the features sizes formed on the reticle due to an etch process. As such, simulations of the reticle manufacturing process can be performed using the sized designs.

In one such example, the method may include using a reticle manufacturing simulation model, or "reticle manufacturing process model," which is configured to predict how the one or more initial metrology target structures will appear when printed at the reticle level. The reticle manufacturing simulation model may include any suitable model known in the art. The reticle manufacturing simulation model may include parameters that account for variations in the reticle manufacturing process as well as a resist and/or one or more additional layers formed on the reticle. For example, the model may take into account a number of parameters of the reticle manufacturing process such as the type of mask writing tool that will be used for manufacture of the reticle, characteristics of the mask writing tool, characteristics of a resist to be used in the reticle manufacturing process, etc. In addition, the user may select one or more parameters of a model describing a process used to fabricate the one or more initial metrology target structures on a reticle, which may be performed as described further herein.

The method may also include using multiple mask making models to simulate how the one or more initial metrology target structures will be formed on the reticle. The multiple mask making models may be configured to simulate completely different processes or the same process but with different process parameters. The different process parameters may include, for example, the exposure dose and focus, different types of mask writing tools, different types of resist, the etch chemistry, and other parameters described herein. The multiple mask making models may be generated by altering one or more parameters of a reticle manufacturing process to generate one or more different reticle manufacturing processes. A model may be generated for each of the different reticle manufacturing processes. Each model may then be used to perform simulations as described herein. This approach allows the user to simulate how the one or more initial metrology target structures will appear if they were written using different mask writing tools or processes, and the best metrology target structure design could be selected for each process as described further herein.

The results of the simulations performed for reticle manufacturing may include one or more images illustrating how the one or more initial metrology target structures will be formed on the reticle and/or any other output that is indicative of how the one or more initial metrology target structures will be formed on the reticle.

The reticle printability of the one or more initial metrology target structure designs may be determined as described above. In this case, the printability is a measure of how accurately the one or more initial metrology target structures will be formed on the reticle. For example, the results of the simulations for the reticle manufacturing process can be compared to the one or more initial metrology target structure designs, and any differences in the one or more initial metrology target structure designs and the simulation results (e.g., missing features, oversized features, distorted features, etc.) can be identified using results of the comparison. In an additional example, one or more characteristics of the results of simulating how the one or more initial metrology target structures will be formed on the reticle may be determined (e.g., using one or more image processing algorithms), and these characteristic(s) may be compared to one or more characteristics of the one or more initial metrology target structure designs to determine differences between the simulation results and the initial designs.

The method may use the results of simulating how the one or more initial metrology target structures will be formed on the reticle as input to a simulation that predicts how the one or more initial metrology target structures will be printed on a wafer by a lithography process. Therefore, since the simulations may be performed based on how the one or more initial metrology target structures will be manufactured on the reticle and "seen" by the wafer, the simulations performed as described herein will be more accurate than simulations performed using any other currently available method.

Although the one or more fabrication processes are described above as including lithography, it is to be understood that the methods may also be applied to other fabrication processes. For example, in some embodiments, the one or more fabrication processes include etch, chemical-mechanical polishing (CMP), deposition, or some combination thereof. Therefore, the embodiments described herein may include consideration of the lithography or photolithography processes as well as other processes such as etch, CMP, and deposition that will be used for manufacturing the metrology target structure on a wafer. For example, depending on when the metrology target structure is to be measured during fabrication (i.e., after which process the metrology target structure is to be measured), the user or the computer-implemented method may select the simulations to be performed, one or more parameters of a model describing the process(es) used to fabricate the wafer, and the simulation results that will be used to select or create the metrology target structure design for the reticle layout.

In one such example, the methods may be used to determine etch-ability of the one or more initial metrology target structure designs by using simulation results illustrating how the initial metrology target structure(s) will be printed on the wafer as input to an etch process model. The etch process model may include any appropriate etch model known in the art. In addition, an etch process model may be created and/or updated as described herein (using experimental data).

In this manner, the embodiments (e.g., optimization of the metrology target structure design) may evaluate the printability of various initial metrology target structure designs on a wafer based on simulations of the processes (e.g., all or some of the processes) used to fabricate the initial metrology target structures on the wafer. As such, the embodiments described herein may be advantageously used to create or select an optimized metrology target structure design that is compatible with any or all of the processes that will be used to fabricate the metrology target structure on the wafer.

The embodiments described herein may also include consideration of interactions between the manufactured metrology target structure and the metrology measurement process. For example, in one embodiment, the method includes simulating measurements of the one or more initial metrology target structures formed on the wafer based on results of simulating how the one or more initial metrology target structures will be formed on the wafer and one or more metrology processes that will be used to measure the metrology target structure on the wafer.

In one such embodiment, the user may select (in the software) the metrology system that will be used to measure one or more characteristics of the metrology target structure. For example, the parameters of various metrology systems may be input to the embodiments described herein prior to use (e.g., during set up). Each set of parameters for a different metrology system may be assigned an identity (e.g., a name), and the various identities of the metrology systems available for measuring the metrology target structure may be presented to the user for selection. Therefore, upon selection of a metrology system identity, the appropriate parameters may be "loaded" into a model for the metrology process that will be used to measure the metrology target structure. The model for the metrology process may have any suitable configuration and may include parameters for the data acquisition and data processing involved in the metrology process.

The metrology system may include any metrology system known in the art, and many different types of metrology systems may be available in a fabrication facility for measuring the metrology target structure. The one or more characteristics of the metrology target structure may include any measurable characteristic(s) of the metrology target structure. In addition, if two or more metrology processes will be used to measure the metrology target structure formed on the wafer (e.g., using one or more metrology systems), the embodiments described herein may be performed for all of the metrology processes that will be performed on the metrology target structure and all of the metrology systems that will be used to perform the metrology processes.

Simulating the measurements of one or more initial metrology target structure designs may include using results of simulating how the one or more initial metrology target structures will be formed on the wafer, which may be generated as described herein, as input to a model describing the metrology process and the metrology tool. For example, software used by the method may include a metrology model that simulates how the metrology tool will "see" the initial metrology target structures formed on the wafer, In this manner, simulating the measurements may include determining an approximate output that will be produced by measurement of the initial metrology target structures (e.g., by detector(s) of the metrology system). The approximate output that will be produced by the measurement may be used with data processing algorithm(s) and/or method(s) to predict one or more characteristics of the initial metrology target structures that will be determined by the metrology process.

The embodiments described herein may also include determining if the one or more initial metrology target structure designs are compatible with one or more metrology processes that will be used to measure the metrology target structure on the wafer. For example, the embodiments described herein may include determining the measurability of various initial metrology target structure designs based on simulations of the metrology process that will be used to measure the metrology target structures on the wafer. In one such example, the method may include determining if one or more characteristics of the initial metrology target structure designs selected to measured by a metrology process and a metrology system can in fact be measured in that metrology process by that metrology system. In particular, the results of the simulations of the measurements may be used to determine if the metrology system will be able to determine the one or more characteristics based on the predicted approximate output of the metrology system.

Results of such comparisons may be used to determine how accurately the one or more characteristics of the initial metrology target structures can be determined by the metrology process. Determining the compatibility of the initial metrology target structure designs with the one or more metrology processes may also include comparing the one or more characteristics of the initial metrology target structures predicted to be determined by the metrology process to one or more characteristics of the initial metrology target structures predicted to be formed on the wafer and/or one or more characteristics of the initial metrology target structure designs.

If the method determines that the one or more characteristics cannot be measured by the metrology tool using the metrology process, the method may include altering one or more of the initial metrology target structure designs and performing the simulations described above until a metrology target structure design is produced that is measurable by the metrology tool using the metrology process. These steps may also be performed if the method determines that the one or more characteristics of the initial metrology target structures cannot be measured accurately by the metrology tool using the metrology process.

The methods described herein can, therefore, be used to determine the reticle manufacturability, wafer printability, and/or measurability of initial metrology target structure designs. In addition, each time an initial metrology target structure design is altered as described above to improve the reticle manufacturability and/or wafer printability of the initial design, the measurability of the altered design may be determined. Alternatively, the measurability of the initial metrology target structure designs may be determined only for the initial metrology target structure designs that are determined to be compatible with the reticle manufacturing and wafer printing processes. Therefore, one or more of the initial metrology target structure designs may be altered several times to achieve compatibility with the reticle manufacturing and wafer printing processes before measurability is determined. In this manner, the method may include determining if one or more initial metrology target structure designs are compatible with both the one or more fabrication processes and the one or more metrology processes.

As described further herein, simulations of the one or more fabrication processes can be performed for different values of one or more parameters of the one or more fabrication processes. In addition, the measurability of the one or more initial metrology target structure designs may be determined for the results of each of the simulations performed for different values of the one or more parameters of the one or more fabrication processes. In this manner, the measurability of the one or more initial metrology target structure designs may be determined across the different values, which can be used to determine if the measurability of the one or more initial metrology target structure designs will change as values of one or more parameters of the one or more fabrication processes change (e.g., drift within the process window).

The methods described herein are advantageous in that they can be used to determine if the metrology target structure can be written on the reticle in a manner that will replicate the intent of the metrology engineer at the reticle plane and if the metrology target structure will print at the wafer level in a manner that will replicate the intent of the metrology engineer and yield the appropriate pattern on the wafer. Therefore, the methods described herein can be used to determine if initial metrology target structure designs are manufacturable at the reticle level and transferable to the wafer level. The methods described herein can also be used to determine if the initial metrology target structure designs are measurable at the wafer level to yield the appropriate metrology information. As such, the methods described herein can be used to determine if the metrology target structure is manufacturable at the reticle level, transferable to the wafer level, and measurable at the wafer level. The methods described herein are, therefore, unique at least in that the concepts described herein can be applied from mask manufacturing to metrology for arbitrary metrology target structure designs and metrology processes.

The method also includes creating the metrology target structure design based on results of simulating how the one or more initial metrology target structures will be formed on the wafer. In addition, as described above, simulating how the one or more initial metrology target structures will be formed on the wafer may include simulating how the one or more metrology target structures will be formed on the wafer at different values of one or more parameters of the one or more fabrication processes.

One example of results of such simulations for lithography is illustrated in FIG. 1. Simulation sample points 10 shown in FIG. 1 illustrate different values of one or more parameters of the lithography process for which the simulation may be performed. The simulations may be performed for the different values and initial metrology target structure designs of the same type, each including the same type of features but having different feature dimensions (e.g., target dimension 1 (TD1), TD2, TD3, and TD4). Results of the simulation may be used to determine if the initial metrology target structure designs, having different feature dimensions TD1, TD2, TD3, and TD4, meet the "ad hoc" constraints representing limitations for the lithography process, which may be performed as described herein.

In one embodiment, the creating step includes determining a process window for the one or more initial metrology target structure designs based on the results of the simulating step and selecting the initial metrology target structure design having the largest process window as the created metrology target structure design. For example, plots labeled TD1, TD2, TD3, and TD4 shown in FIG. 1 are Bossung plots that show the process window of the initial metrology target structures having the various feature dimensions described above. The process windows for the initial metrology target structure designs may be determined as described herein (e.g., based on the printability of the designs at different values of the process parameter(s)). Therefore, the Bossung plots shown in FIG. 1 may be compared to determine which initial metrology target structure design has the largest process window. In this manner, the metrology target structure design having the largest process window (in this example, the initial metrology target structure design having feature dimension TD1) may be selected as the created metrology target structure design.

In another embodiment, the creating step includes determining a process window for the one or more initial metrology target structure designs based on the results of the simulating step, comparing the process window for the one or more initial metrology target structure designs to a process window for device structures to be formed on the wafer using the one or more fabrication processes, and selecting the metrology target structure design based on the one or more initial metrology target structure designs that have a process window that is larger than the process window for the device structures. The process windows of the one or more initial metrology target structure designs may be determined as described above. In addition, the process window for the device structures may be determined in any manner known in the art.

The process windows of the various initial metrology target structure designs may be compared to the device process window in any suitable manner. In the example shown in FIG. 1, the plot labeled "Device Structure" is a Bossung plot that shows the process window of the device structures (e.g., contact holes). As such, comparing the process windows for the one or more initial metrology target structure designs to the process window for the device structures may be performed by comparing the Bossung plots for the initial metrology target structure design(s) and the device structures. In this manner, an initial metrology target structure design having a process window that is equal to or larger than the process window of the device structures may be selected as the created and/or optimized metrology target structure design. For example, as shown in FIG. 1, the initial metrology target structure designs having feature dimensions TD1, TD2, and TD3 have process windows that are larger than the process window of the device structures. In contrast, the initial metrology target structure design having feature dimension TD4 has a process window that is smaller than the process window of the device structures. As such, one of the initial metrology target structure designs having feature dimensions TD1, TD2, and TD3, but not TD4, may be selected as the created metrology target structure design. In this manner, regardless of where the process is performing within the device process window, the metrology target structure can be printed on the wafer.

In some embodiments, the creating step includes determining if the one or more initial metrology target structure designs are compatible with the one or more fabrication processes based on the results of the simulating step. For example, as described herein, the simulation results may indicate and/or may be used to determine if the one or more initial metrology target structure designs are printable using a lithography process. The one or more initial metrology target structure designs that are determined to be printable may be determined to be compatible with the lithography process. Determining if the one or more initial metrology target structure designs are compatible with the one or more fabrication processes may also be determined based on any other information described herein. For example, the process window determined for the one or more initial metrology target structure designs may be compared to a minimum process window required for the one or more fabrication processes, the process window for device structures, typical drifts in one or more parameters of the one or more fabrication processes, or some combination thereof to determine if the process windows of the initial metrology target structure design(s) are compatible with the one or more fabrication processes. The metrology target structure design for the reticle layout may be created based on the one or more initial metrology target structure designs that are determined to be compatible with the one or more fabrication processes. For example, creating the metrology target structure design for the reticle layout may include selecting the initial metrology target structure design that is most compatible with the one or more fabrication processes as the created design.

In another embodiment, the creating step includes creating the metrology target structure design based on the results of simulating how the one or more initial metrology target structures will be formed on the wafer and simulating the measurements. These simulations may be performed as described herein. Creating the metrology target structure design may be performed based on the results of the simulations as described further herein. For example, in one embodiment, the creating step includes determining if the one or more initial metrology target structure designs are compatible with one or more metrology processes that will be used to measure the metrology target structure on the wafer. In one such example, as described herein, the simulation results may indicate and/or may be used to determine if the one or more initial metrology target structure designs are measurable using one or more metrology processes. The one or more initial metrology target structure designs that are determined to be measurable may be determined to be compatible with the one or more metrology processes. Determining if the one or more initial metrology target structure designs are compatible with the one or more metrology processes may also be determined based on any other information described herein. The metrology target structure design for the reticle layout may be created based on the one or more initial metrology target structure designs that are determined to be compatible with the one or more metrology processes. For example, creating the metrology target structure design for the reticle layout may include selecting the initial metrology target structure design that is most compatible with the one or more metrology processes as the created design. In addition, the creating step may include selecting the initial metrology target structure design that produces the best reticle manufacturability, wafer printability, and/or measurability for the metrology target structure, which may be determined as described herein.

In some embodiments, the creating step includes optimizing one of the one or more initial metrology target structure designs based on the results of the simulating step. For example, the embodiments described herein may include a piece of software (or two or more pieces of interacting software) that can be used to optimize metrology target structures in a reticle layout. In addition, simulations of the lithography or photolithography process and/or the metrology process and/or the manufacturing process may be performed as described herein, and the layout for the target may be optimized based on the results of the simulations. For example, the embodiments described herein may be advantageously used to create or select an optimized metrology target structure design that is measurable or that is the most measurable.

In some embodiments, the creating step includes applying constraints to the results of the simulating step. The constraints represent limitations for the one or more fabrication processes and one or more metrology processes that will be used to measure the metrology target structure on the wafer. In addition, constraints applied to the optimization may represent limitations of the lithography or photolithography process and/or manufacturing process and/or metrology process.

In some embodiments, optimizing one of the initial metrology target structure designs includes altering the initial metrology target structure design based on results of the simulating step, for example, to improve the printability of the initial metrology target structure design, to increase the process window for the initial metrology target structure design, to improve the measurability of the initial metrology target structure design, or some combination thereof. Such alterations may be performed using any suitable algorithm, rules, method, or some combination thereof. For example, if the results of the simulations of the measurements indicate that one or more of the initial metrology target structure designs are not measurable, the results of the simulations for the lithography process may be compared to constraints for the metrology process to determine if one or more characteristics such as CD of the one or more initial metrology target structures as predicted to be formed on the wafer are outside of the limitations for the measurements. Based on such comparisons, one or more characteristics of the one or more initial metrology target structure designs may be altered. For example, the CD of one or more features included in one or more of the initial metrology target structure designs may be increased or decreased based on the results of the comparison.

Creating and/or optimizing the metrology target structure design in any of the steps as described above may include creating and/or optimizing any features and/or characteristics of the metrology target structure design. For example, in some embodiments, optimizing the features and/or characteristics of the metrology target structure design includes creating and/or optimizing one or more optical proximity correction (OPC) features of the metrology target structure design for metrology purposes. In one such example, the simulating step may include optimizing the design features such as sub-resolution (metrology not lithography) assist features, spaces, serifs, or hammerheads, of the metrology target structure design. Such optimization may be performed to enhance the metrology performance in terms of cross-talk reduction between features in different layers, resulting in more accurate and precise metrology, particularly for metrology target structures that are smaller than about 15 $\mu m^2$. Such optimization may also or alternatively be performed to enhance the metrology performance in terms of ringing or modulation reduction in the resultant image due to partial coherence of the metrology system optics, which may also be crucial when the metrology target structures are relatively small.

As such, this embodiment of the computer-implemented method is configured for "automatic" initial metrology target structure design correction. For example, for all of the process steps described herein (e.g., reticle writing, pattern transfer to the wafer level, and metrology), it is possible to create auto-correlation software that is configured to redraw the initial metrology target structure designs so that they do pass the desired rules thereby automating the correction process. In one implementation, this correction may be performed automatically by software in a closed loop method with no user intervention. In addition, after a design is altered, additional simulation(s) may be performed as described above for the altered design, and the printability and/or measurability of the altered design may be determined.

The computer-implemented methods described herein may be implemented using software that may be operated either on a computer system or a local network of computers, or over a remote connection such as a web based Internet connection. This mode may be especially useful for fabless semiconductor companies who send their designs out to foundries for manufacturing. By checking their design before shipping the design to the foundry, errors may be caught and corrected quickly thereby greatly reducing the cost and cycle time of the manufacturing process.

In some embodiments, the computer-implemented method includes selecting (or optimizing) one or more parameters of a recipe for a metrology system (e.g., the metrology system that will be used to perform the metrology process on the metrology target structure). For example, selecting the parameter(s) of the recipe may be performed simultaneously with creating the metrology target structure design as a further set of parameters to be varied during the optimization process. Alternatively, selecting the parameter(s) of the recipe may be performed subsequently to creating the metrology target structure design as an additional optimization step. In either case, the recipe parameter(s) such as illumination NA, spectral band, focus, etc., which are commonly referred to as "far field" parameters, are much less computationally intensive than the electromagnetic (EM) simulation used for optimizing the metrology target structure design parameters. So, in short, in addition, to outputting an optimized metrology target structure design, the method may output an optimized metrology system recipe. Optimizing the metrology recipe may also be performed as described in commonly assigned U.S. Patent Application Ser. No. 60/729,268 by Widmann et al. filed Oct. 21, 2005, which is incorporated by reference as if fully set forth herein.

In one embodiment, the method includes storing a layout for the created metrology target structure design in a standard format for the reticle layout. For example, the result of the optimization is a metrology target structure design that can be output in a standard format such as a GDSII file and/or any of the other file types described herein. The GDSII file may be used to create reticle layout data that can be used to manufacture the reticle. For example, the embodiments described herein may be connected to a CAD reticle design tool. The embodiments may be coupled to the CAD reticle design tool in any suitable manner known in the art. In this manner, the output of the optimized GDS file may be automatically inserted into the die or into the scribe line of the reticle. Such automatic insertion of the optimized GDS file may be performed as described in commonly assigned U.S. patent application Ser. No. 10/858,836 by Cohen et al., filed Jun. 1, 2004, which is incorporated by reference as if fully set forth herein. In addition, the GDSII file may be used to create a metrology process (e.g., a metrology recipe). For example, the GDSII file may indicate the types of measurements to be performed on the metrology target structure and/or the location of the metrology target structure on the wafer. The optimized metrology target structure design may also be presented to the user, who can save the target layout into a standard format such as a GDSII file. The created metrology target structure design may also be stored in a database of previously used metrology target structure designs. The database may also provide previous metrology target structure designs to the embodiments described herein.

The embodiments described herein have a number of advantages over other methods and systems for creating a metrology target structure design. For example, in the past, metrology target structure optimization was performed experimentally by trial and error and by "rules of thumb" based on prior experience. In particular, the currently used processes may include generating metrology tool target design recommendations and converting the target design recommendations into GDS format. The processes may also include running the metrology target design in the GDS format through a CAD tool for OPC features to avoid violations. The processes may also include printing the metrology target designs on a reticle and processing wafers with the reticle. If the metrology target designs did not print well on the wafers, the metrology target designs may be altered to attempt to optimize the designs. The altered designs may then be run through the CAD tool as described above and other steps described above may be performed with the altered designs. If the metrology target designs did print well on the wafers, then the metrology target design process may be performed for the next layer of the device.

Accordingly, because each trial corresponds to a new reticle and a set of experiments with the new reticle to test the performance of the metrology target structure, trial and error based design is slow and costly. In contrast, all steps of the computer-implemented method embodiments described herein may be performed prior to fabrication of a reticle using the reticle layout. In this manner, creating a metrology target structure design for a reticle layout as described herein can be performed without reticle fabrication thereby substantially reducing the costs of designing the metrology target structure. In addition, "rules of thumb" are often considered intellectual property so that widespread dissemination of the rules themselves may not be possible. As such, lack of new metrology target structure adoption and/or suboptimal metrology target structures were often the results of this approach.

The embodiments described herein perform simulation of the lithography or photolithography and/or manufacturing process and/or metrology process thereby allowing optimization of the metrology target structure design with fewer trials (possibly only a single trial). In this manner, metrology target structure designs can be optimized as described herein for process compatibility, and the process simulations may provide a design for manufacturing (DFM) opportunity to reduce the cycle time and ensure first time success on silicon for metrology target structures. Consequently, the embodiments described herein shorten the metrology optimization cycle. In addition, the embodiments described herein provide an opportunity for differentiation from previously used metrology target structures particularly since metrology target structures are becoming more complex and are beginning to migrate to extremely sensitive areas of the chip. Therefore, metrology target structure design is becoming more cumbersome for metrology engineers who have to increasingly rely on assistance from chip designers, process integration engineers, and layout engineers to design good metrology target structures. However, the embodiments described herein make creating metrology target structure designs much easier with a shorter cycle time. Moreover, the software implementation of the known constraints and target design consideration (or "rules of thumb") as described herein can deliver the benefits of the rules of thumb expertise of a metrology engineer without the inherent uncertainty and disadvantages of such manual creation of metrology target structure designs.

The embodiments described herein can, therefore, greatly reduce the time to fabrication of good reticles with good metrology target structures in the complete manufacturing cycle by reducing costly delays and "re-spins." A re-spin is the worst case scenario in which the reticles are made, wafers are processed, and then measurements performed on the wafer indicate that the metrology target structure is unusable. The metrology target structure design must then be reworked, new reticles made, and new wafers produced, all at great cost and with serious delays in time-to-market. Therefore, the embodiments described herein may also reduce excessive reticle write time trying to write reticles with unprintable and/or unmeasurable metrology target structures and reduce the chance that the metrology target structures will fail to be properly measurable due to errors in the layout.

The models used in the embodiments described herein can also be calibrated to reflect the actual mask manufacturing process either through the use of external data (scanning electron microscope (SEM) images) or by data sharing with existing calibration schemes employed by die-to-database reticle inspection tools. Such calibration of the models may increase the accuracy of the embodiments described herein. For example, the method may include making the mask using the created metrology target structure design. The method may also include inspecting or verifying the metrology target structure after the reticle has been fabricated. Inspecting or verifying the metrology target structure in this method may be performed using any reticle inspection and/or metrology tool known in the art.

The method may also include altering the model of the reticle manufacturing process using data measured on reticles fabricated using the reticle manufacturing process. For example, the mask making model may be updated with experimental information about the reticle generated by inspection and/or metrology. The updated mask making model may then be used to generate additional simulated images of the initial metrology target structure designs. In this manner, the mask process model may be calibrated using inspection and/or metrology data or any other external source of data, such as SEM images, or by linking the model updating function to the built-in calibration function that is available on die-to-database reticle inspection tools that are commercially available from KLA-Tencor, San Jose, Calif.

Inspecting and/or measuring the manufactured reticle as described above may be performed to determine if there are problems with the metrology target structure formed on the reticle. In addition, if there are problems with the metrology target structure formed on the reticle, the created metrology target structure design may be modified based on the inspection and/or metrology data using the embodiments described herein, and the modified design may be used to fabricate another mask.

The fabricated reticle may be used to print wafers. The wafers may be printed using the lithography process for which the simulations were performed. In addition, the wafers may be printed using the best known process parameters (e.g., focus, exposure, etc.) of the Lithography process. The metrology target structure formed on the wafer may also be inspected and/or measured (e.g., using the metrology process for which the simulations were performed). The results of the inspection and/or measurements of the metrology target structure may be used to determine how well the metrology target structure printed on the wafer. For example, the results of the inspection and/or measurements may be compared to the created metrology target structure design to determine if the metrology target structure printed on the wafer relatively accurately. If the metrology target structure did not print well on the wafer, the results of the inspection and/or measurements may be used to alter the created metrology target structure design, and the steps described herein may be performed for the altered design. If the metrology target structure did print well on the wafer, the methods described herein may be performed for another process layer.

The results of simulating how the created metrology target structure design will be formed on the wafer may be compared to actual images or measurements of the metrology target structure formed on the wafer. Such comparisons may be used to verify the wafer model. For example, experimental data generated by inspection and/or metrology of the printed wafers may be compared to the simulation results. Any differences between the printed wafers and the simulation results may be analyzed to determine if the differences indicate an inaccuracy in the model. The differences between the printed images and the simulation results may then be used to correct this and any other inaccuracies. Therefore, the method may include altering a lithography process model using data measured on wafers printed using the lithography process. Any other models described herein may be updated, corrected, and/or calibrated as described above.

The methods described herein, therefore, may link the simulation of the initial metrology target structure designs to actual measured masks and wafers to ensure that the models are valid to within the required tolerances. Each design that is verified and approved by this process can be used to manufacture masks and wafers which can then be measured by the appropriate tools. The data collected from the mask inspection and/or metrology tools and the wafer inspection and/or metrology tools can then be compared to the model predictions. The models can be constantly updated to ensure that they represent the most current status of various processes. Monitoring techniques can be applied to identify cases in which the actual mask or wafer results fail to agree with the model predictions, and the model can be updated accordingly, or the process retuned, to restore the correct correlation between predicted and actual results.

Figure 2:
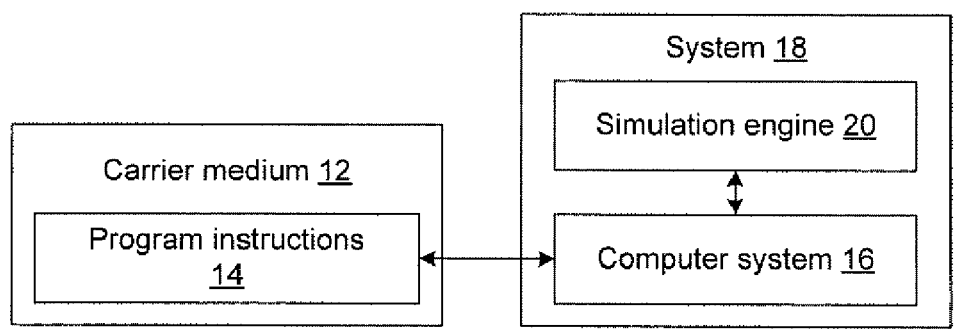
FIG. 2 is a block diagram illustrating one embodiment of a carrier medium that includes program instructions executable on a computer system for performing a computer-implemented method for creating a metrology target structure design for a reticle layout and one embodiment of a system configured to create a metrology target structure design for a reticle layout.

Another embodiment relates to a carrier medium that includes program instructions executable on a computer system for performing a computer-implemented method for creating a metrology target structure design for a reticle layout. One such embodiment is shown in FIG. 2. In particular, as shown in FIG. 2, carrier medium 12 includes program instructions 14 executable on computer system 16.

The computer-implemented method includes simulating how one or more initial metrology target structures will be formed on a wafer based on one or more fabrication processes that will be used to form a metrology target structure on the wafer and one or more initial metrology target structure designs. Simulating how the one or more initial metrology target structures will be formed on the wafer may be performed as described herein. The method also includes creating the metrology target structure design based on results of the simulating step. Creating the metrology target structure design may be performed as described further herein. The computer-implemented method for which the program instructions are executable may include any other step(s) described herein.

Program instructions 14 implementing methods such as those described herein may be transmitted over or stored on carrier medium 12. The carrier medium may be a transmission medium such as a wire, cable, or wireless transmission link. The carrier medium may also be a storage medium such as a read-only memory, a random access memory, a magnetic or optical disk, or a magnetic tape.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system may also include any suitable processor known in the art such as a parallel processor. In addition, the computer system may include a computer platform with high speed processing and software, either as a standalone or a networked tool.

Another embodiment relates to a system configured to create a metrology target structure design for a reticle layout. One embodiment of such a system is shown in FIG. 2. As shown in FIG. 2, system 18 includes simulation engine 20 configured to simulate how one or more initial metrology target structures will be formed on a wafer based on one or more fabrication processes that will be used to form a metrology target structure on the wafer and one or more initial metrology target structure designs. The simulation engine may be configured to perform the simulation as described further herein. The simulation engine may also be configured to perform any other simulation step(s) described herein. The simulation engine may include any appropriate hardware and/or software that can be configured to perform one or more of the simulations as described herein.

System 18 also includes computer system 16 configured to create the metrology target structure design based on output of the simulation engine. The output of the simulation engine used by the computer system to create the metrology target structure design may include any of the results of any of the simulations described herein. The computer system may be configured to create the metrology target structure design as described further herein. In addition, the computer system may be configured to perform any other step(s) of any method embodiment(s) described herein. The computer system may be further configured as described herein. The system may also be further configured as described herein.

In some embodiments, the system may include an inspection and/or metrology tool (not shown). The inspection and/or metrology tool may be configured to detect defects and/or to measure one or more characteristics of metrology target structures formed on the reticle and/or wafer. The inspection and/or metrology tool may be coupled to the computer system in any suitable manner. The tool may have any suitable configuration known in the art. In addition, the tool may have various configurations such as optical imaging systems, ellipsometer-based systems, scatterometer-based systems, or e-beam systems such as a CD SEM. Furthermore, the system may be configured as a stand alone tool. For example, the system may include one or more components that are specifically designed (and optionally dedicated) to performing one or more of the methods described herein.

The methods described herein may also include any step(s) of any method(s) described in commonly assigned U.S. patent application Ser. Nos. 11/154,310 by Verma et al., filed Jun. 16, 2005 and 11/226,698 by Verma et al., filed Sep. 14, 2005 published as U.S. Patent Application Publication No. 2006/0062445 on Mar. 23, 2006, which are incorporated by reference as if fully set forth herein. Furthermore, examples of metrology target structures that may be optimized as described herein are illustrated in commonly assigned U.S. patent application Ser. No. 11/187,609 by Monahan et al., filed Jul. 22, 2005 published as U.S. Patent Application Publication No. 2006/0024850 on Feb. 2, 2006, which is incorporated by reference as if fully set forth herein.

Further modifications and alternative embodiments of various aspects of the invention may be apparent to those skilled in the art in view of this description. For example, computer-implemented methods, carrier media, and systems for creating a metrology target structure design for a reticle layout are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for creating a metrology target structure design for a reticle layout, comprising:
    generating one or more initial metrology target structure designs using a set of rules selected based on one or more parameters describing one or more metrology processes that will be used to measure a metrology target structure on a wafer;
    simulating how one or more initial metrology target structures will be formed on the wafer using input, wherein the input comprises one or more fabrication processes that will be used to form the metrology target structure on the wafer and the one or more initial metrology target structure designs, and wherein said simulating comprises simulating how the one or more initial metrology target structures will be formed on the wafer at different values of one or more parameters of the one or more fabrication processes; and
    creating the metrology target structure design based on results of said simulating, wherein said creating comprises determining a process window for the one or more initial metrology target structure designs based on the results of said simulating, comparing the process window for the one or more initial metrology target structure designs to a process window for device structures to be formed on the wafer using the one or more fabrication processes, and selecting the metrology target structure design based on the one or more initial metrology target structure designs that have a process window that is larger than the process window for the device structures.

2. The method of claim 1, wherein all steps of the computer-implemented method are performed automatically.

3. The method of claim 1, wherein all steps of the computer-implemented method are performed prior to fabrication of a reticle using the reticle layout.

4. The method of claim 1, further comprising generating the one or more initial metrology target structure designs using a set of rules selected based on one or more parameters describing the one or more fabrication processes.

5. The method of claim 1, further comprising generating the one or more initial metrology target structure designs by simulating measurements of the one or more initial metrology target structures based on the one or more metrology processes that will be used to measure the metrology target structure on the wafer.

6. The method of claim 1, further comprising simulating measurements of the one or more initial metrology target structures formed on the wafer based on the results of simulating how the one or more initial metrology target structures will be formed on the wafer and the one or more metrology processes that will be used to measure the metrology target structure on the wafer, wherein said creating further comprises creating the metrology target structure design based on the results of said simulating how the one or more initial metrology target structures will be formed on the wafer and said simulating the measurements.

7. The method of claim 1, wherein said creating further comprises selecting the initial metrology target structure design having the largest process window as the created metrology target structure design.

8. The method of claim 1, wherein said creating further comprises applying constraints to the results of said simulating, and wherein the constraints represent limitations for the one or more fabrication processes and the one or more metrology processes that will be used to measure the metrology target structure on the wafer.

9. The method of claim 1, wherein said creating further comprises optimizing one of the one or more initial metrology target structure designs based on the results of said simulating.

10. The method of claim 1, further comprising storing a layout for the created metrology target structure design in a standard format for the reticle layout.

11. The method of claim 1, wherein the one or more fabrication processes comprise lithography.

12. The method of claim 1, wherein the one or more fabrication processes comprise etch.

13. The method of claim 1, wherein the one or more fabrication processes comprise chemical-mechanical polishing.

14. The method of claim 1, wherein the one or more fabrication processes comprise deposition.

15. The method of claim 1, wherein said creating further comprises determining if the one or more initial metrology target structure designs are compatible with the one or more fabrication processes based on the results of said simulating.

16. The method of claim 1, wherein said creating further comprises determining if the one or more initial metrology target structure designs are compatible with the one or more metrology processes that will be used to measure the metrology target structure on the wafer.

17. A storage medium, comprising program instructions executable on a computer system for performing a computer-implemented method for creating a metrology target structure design for a reticle layout, wherein the computer-implemented method comprises:

generating one or more initial metrology target structure designs using a set of rules selected based on one or more parameters describing one or more metrology processes that will be used to measure a metrology target structure on a wafer;

simulating how one or more initial metrology target structures will be formed on the wafer using input, wherein the input comprises one or more fabrication processes that will be used to form the metrology target structure on the wafer and the one or more initial metrology target structure designs, and wherein said simulating comprises simulating how the one or more initial metrology target structures will be formed on the wafer at different values of one or more parameters of the one or more fabrication processes; and creating the metrology target structure design based on results of said simulating, wherein said creating comprises determining a process window for the one or more initial metrology target structure designs based on the results of said simulating, comparing the process window for the one or more initial metrology target structure designs to a process window for device structures to be formed on the wafer using the one or more fabrication processes, and selecting the metrology target structure design based on the one or more initial metrology target structure designs that have a process window that is larger than the process window for the device structures.

18. A system configured to create a metrology target structure design for a reticle layout, comprising:

a simulation engine configured to simulate how one or more initial metrology target structures will be formed on a wafer using input, wherein the input comprises one or more fabrication processes that will be used to form a metrology target structure on the wafer and one or more initial metrology target structure designs, and wherein the simulation engine is further configured to simulate how the one or more initial metrology target structures will be formed on the wafer at different values of one or more parameters of the one or more fabrication processes; and a computer system configured to create the metrology target structure design based on output of the simulation engine, wherein the computer system is further configured to create the metrology target structure design by determining a process window for the one or more initial metrology target structure designs based on the output of the simulation engine, comparing the process window for the one or more initial metrology target structure designs to a process window for device structures to be formed on the wafer using the one or more fabrication processes, and selecting the metrology target structure design based on the one or more initial metrology target structure designs that have a process window that is larger than the process window for the device structures, and wherein the computer system is further configured to generate the one or more initial metrology target structure designs using a set of rules selected based on one or more parameters describing one or more metrology processes that will be used to measure the metrology target structure on the wafer.

* * * * *